United States Patent [19]

Amigo

[11] Patent Number: 4,584,527
[45] Date of Patent: Apr. 22, 1986

[54] AC ELECTRIC ENERGY METER HAVING SHIELDED RADIATION RESPONSIVE DATA INTERFACE

[75] Inventor: Jorge L. Amigo, Durham, N.C.

[73] Assignee: Westinghouse Electric Corp., Pittsburgh, Pa.

[21] Appl. No.: 479,065

[22] Filed: Mar. 25, 1983

[51] Int. Cl.⁴ .................. G01R 11/04; H04B 9/00; G08C 9/06
[52] U.S. Cl. .................. 324/157; 340/870.02; 346/14 MR
[58] Field of Search .................. 324/96, 157; 350/266, 350/269; 340/870.02; 346/14 MR; 364/713; 365/64

[56] References Cited

U.S. PATENT DOCUMENTS

| | | | |
|---|---|---|---|
| 3,748,654 | 7/1973 | Sutherland | 346/14 MR |
| 4,298,839 | 11/1981 | Johnston | 324/157 |
| 4,332,450 | 6/1982 | Griffith | 350/269 |
| 4,491,792 | 1/1985 | Bullock et al. | 324/157 |

*Primary Examiner*—Ernest F. Karlsen
*Assistant Examiner*—Walter E. Snow
*Attorney, Agent, or Firm*—William D. Lanyi

[57] ABSTRACT

A watt-hour metering system includes a meter enclosed in a transparent cover and having an electronic register with a multichannel infra-red responsive data I/O port, and a portable electronic programmer/reader having a complementary infra-red data I/O port. The meter includes a pivoting shutter inside the cover having a pair of magnets affixed thereto and held by gravity in a position to shield at least one channel of the I/O port from radiation entering the cover. An activating magnet is affixed to the programmer/reader such that when the programmer/reader is placed against the meter cover, magnetic flux is coupled to the shutter magnets to cause the shutter to pivot and permit the transmission of infra-red radiation between the I/O port and the programmer/reader. Alternatively, a shutter is pivotally secured to the cover and manually operable from outside the cover to selectively permit and prevent transmission of radiation between the I/O port and programmer/reader.

18 Claims, 6 Drawing Figures

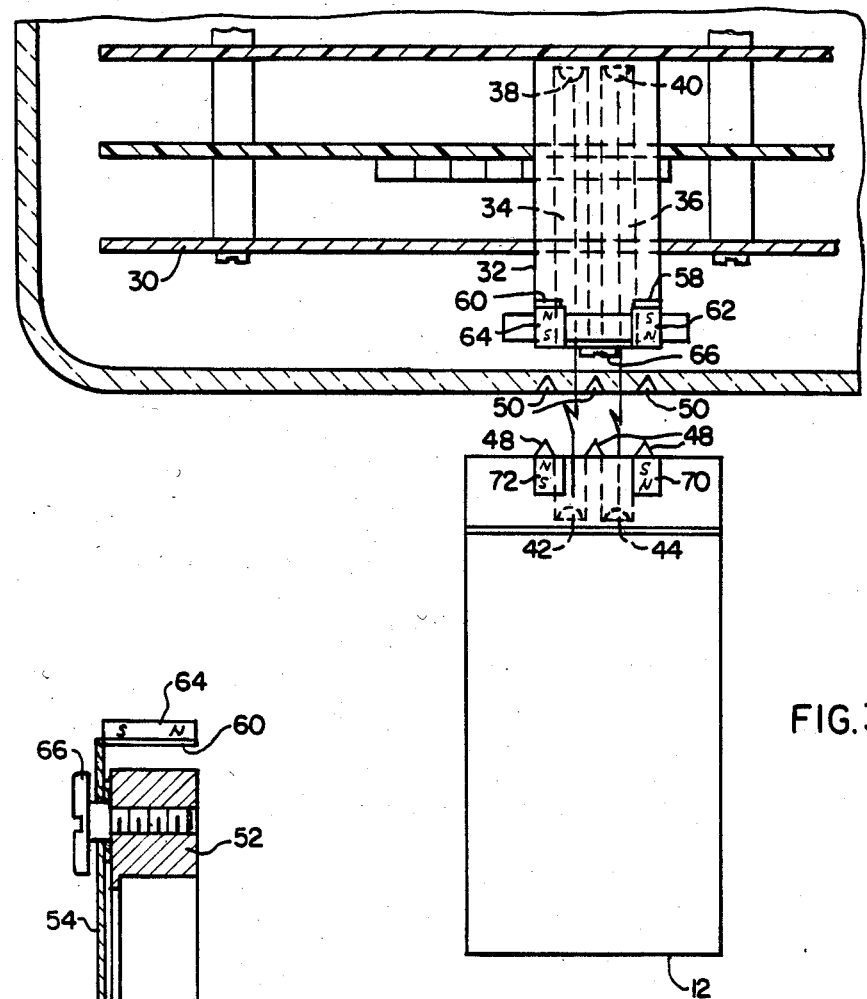
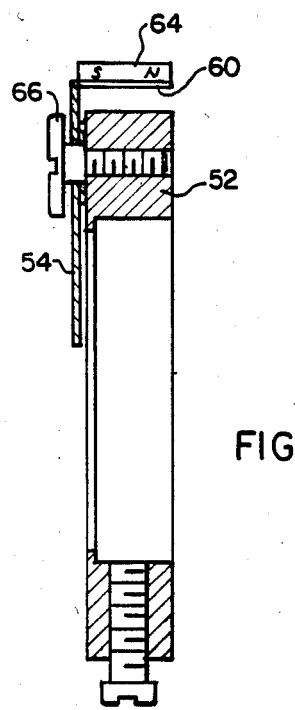
FIG. 3.
FIG. 4.

AC ELECTRIC ENERGY METER HAVING SHIELDED RADIATION RESPONSIVE DATA INTERFACE

BACKGROUND OF THE INVENTION

1. Field of the Invention

This invention relates to electric power distribution apparatus and more particularly to metering apparatus employing a radiation responsive data interface having a magnetically operated ambient radiation shield.

2. Description of the Prior Art

AC watt-hour meters having electronic registers with radiation responsive interfaces are known in the art. For example, U.S. Pat. No. 4,298,839 discloses apparatus including a four-channel optically coupled interface by which the electronic register can be selectively read and programmed by portable electronic programmer/reader apparatus which transmits an infra-red beam through the transparent cover of the meter. A radiation shielding baffle is provided between the infra-red emitters and detectors of the register and the transparent portion of the cover. The shielding baffle includes separate tunnel apertures each aligned with a separate pair of emitters and detectors to isolate the separate radiations for transmitting noninterfering radiation to and from the detectors and emitters. This arrangement provides satisfactory operation over a wide variety of operating environments.

Electronic registers often include light-emitting data display devices, such as vacuum-fluorescent numeric readouts. In installations were the light from such readout devices would be annoying or objectionable, or in certain situations to avoid attracting attention to the installation, means are provided to cause these light-emitting readout devices to become inactive during certain periods. Also included are means for temporarily reactivating the light-emitting readout devices upon command.

In some operating environments which exhibit a high level of ambient radiation, it has been found that undesirable responses by the optical interface may occur. It would therefore be desirable to provide metering apparatus having an electronic register which would provide protection against interference from high ambient radiation levels yet which would permit meter reading and programming operations to proceed without obstruction. It would further be desirable to provide such apparatus which would allow light-emitting readout devices of the meter to be energized upon command during those periods when such readout devices are normally disabled.

SUMMARY OF THE INVENTION

In accordance with the principles of the present invention, electric power distribution apparatus is provided which includes a fixed data processing component such as a watt-hour meter coupled to an electric utility power distribution circuit for processing data related to the circuit. The fixed component comprises an electronic register having a radiation responsive input port for receiving external data transmitted to the fixed component. A cover is attached to the fixed component to provide protection while permitting the transmission of radiation therethrough.

A portable data processing component, such as an electronic programmer/reader, is provided for generating radiation modulated with data to be transmitted to the fixed component. A shutter is attached to the fixed component inside of the cover to prevent radiation transmitted through the cover from reaching the input port. The shutter is responsive to magnetic flux coupled through the cover to selectively permit transmission of radiation through the cover to the input port. The fixed component includes activating apparatus attached thereto for coupling magnetic flux through the cover to the shutter such that the shutter is activated to permit transmission of radiation between the fixed component and the portable component when the portable component is brought into proximity with the cover.

The input port may comprise a multichannel input port and the shutter may include means for selectively shielding the input port such that at least one channel of the input port is exposed at all times to receive radiation transmitted through the cover. In this manner, it is not necessary to provide the programmer/reader in order to generate a pulse of radiation to the input port for activating a selected function of the fixed component.

In an alternative embodiment, the shutter plate may be pivotally mounted on the cover of the fixed component and operated with a key lever attached on the outside of the cover to the pivot pin of the shutter plate. The key lever may include means for locking the shutter plate in a fixed position.

BRIEF DESCRIPTION OF THE DRAWINGS

FIG. 3 is a top elevational view showing the electronic programmer/reader and watt-hour meter of FIG. 1 in a position operative to provide transmission of data therebetween by a transmitted radiation;

FIG. 4 is a side elevational veiw of a magnetically activated shutter situated on the input port of the electronic register of FIGS. 1-3 which provides for a selective shielding of the input port from ambient radiation transmitted through the cover;

DESCRIPTION OF THE PREFERRED EMBODIMENT

Figure 1:
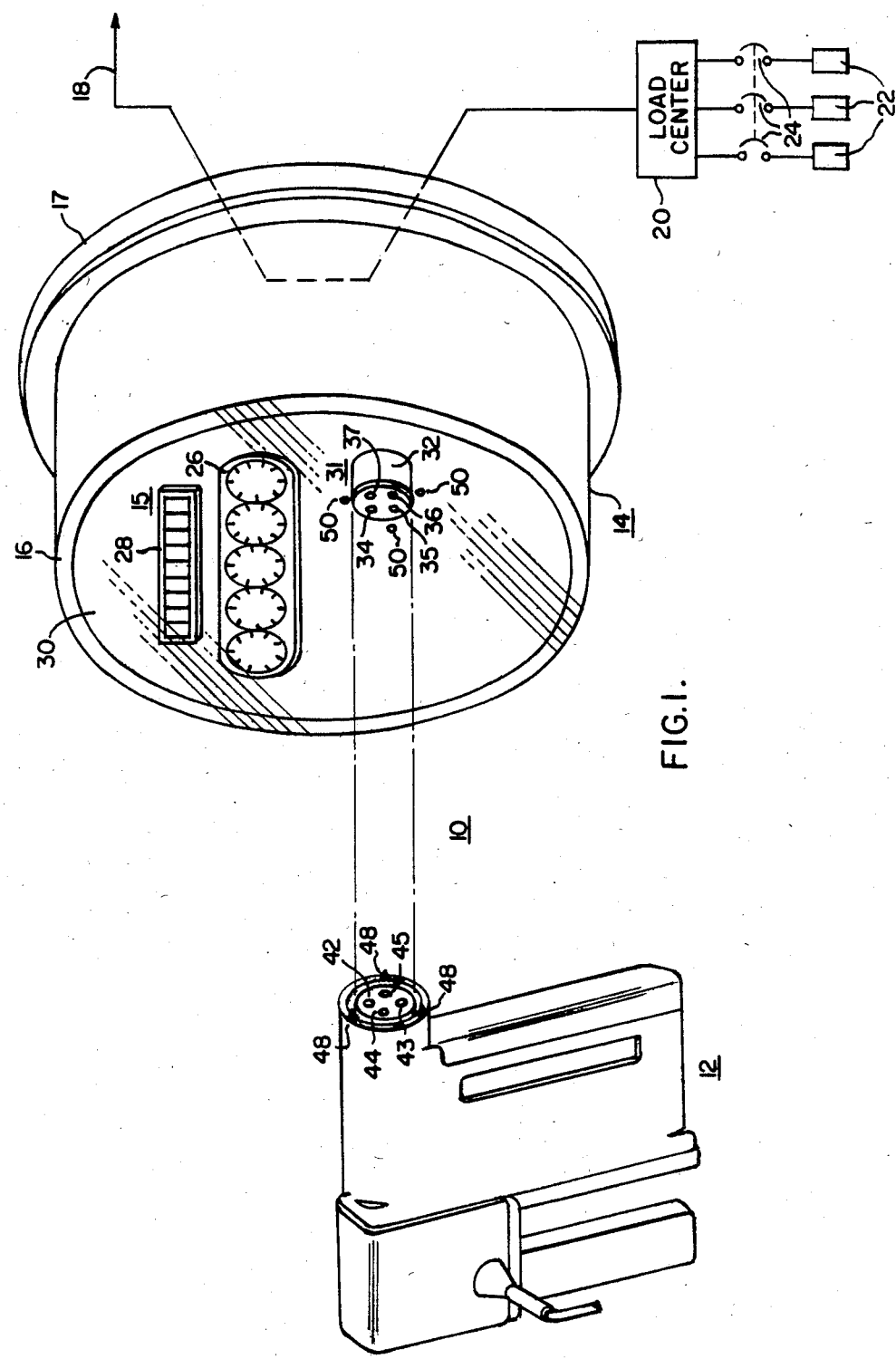
FIG. 1 is a view partially schematic and partially in perspective of a watt-hour meter having an electronic register and coupled to a secondary power distribution conductor, and a portable electronic programer/reader made in accordance with the principles of the present invention.

Referring now to the drawings, and more particularly to FIG. 1, there is shown a diagram partially schematic and partially in perspective of electric utility distribution apparatus 10 incorporating the principles of the present invention. The apparatus 10 includes a programmable AC electric energy meter 14 having an electronic register 15 of the type described more completely in the aforementioned U.S. Pat. No. 4,298,839. The meter 14 is fixedly coupled to conductors of an electric utility distribution secondary circuit 18. The circuit 18 supplies a load center 20 located at an electric utility customer site which in turn distributes power to loads 22 through circuit breakers 24. The meter 14 is protected from environmental contamination by a transparent cover 16 attached to a meter base 17 and is operative to calculate and accumulate different measured parameters of the electric energy flowing in the conductors 18. Traditionally the meter 14 would provide an indication of the watt-hours of electric energy utilized by the utility customer in the loads 22 supplied by the circuit 18. Other information may also be accumulated, such as time-of-day multirate metering data and kilowatt demand data. As is described in the aforementioned U.S. Pat. No. 4,298,839, this data is processed and stored under the control of the electronic register 15 contained in the meter 14.

Figure 2:
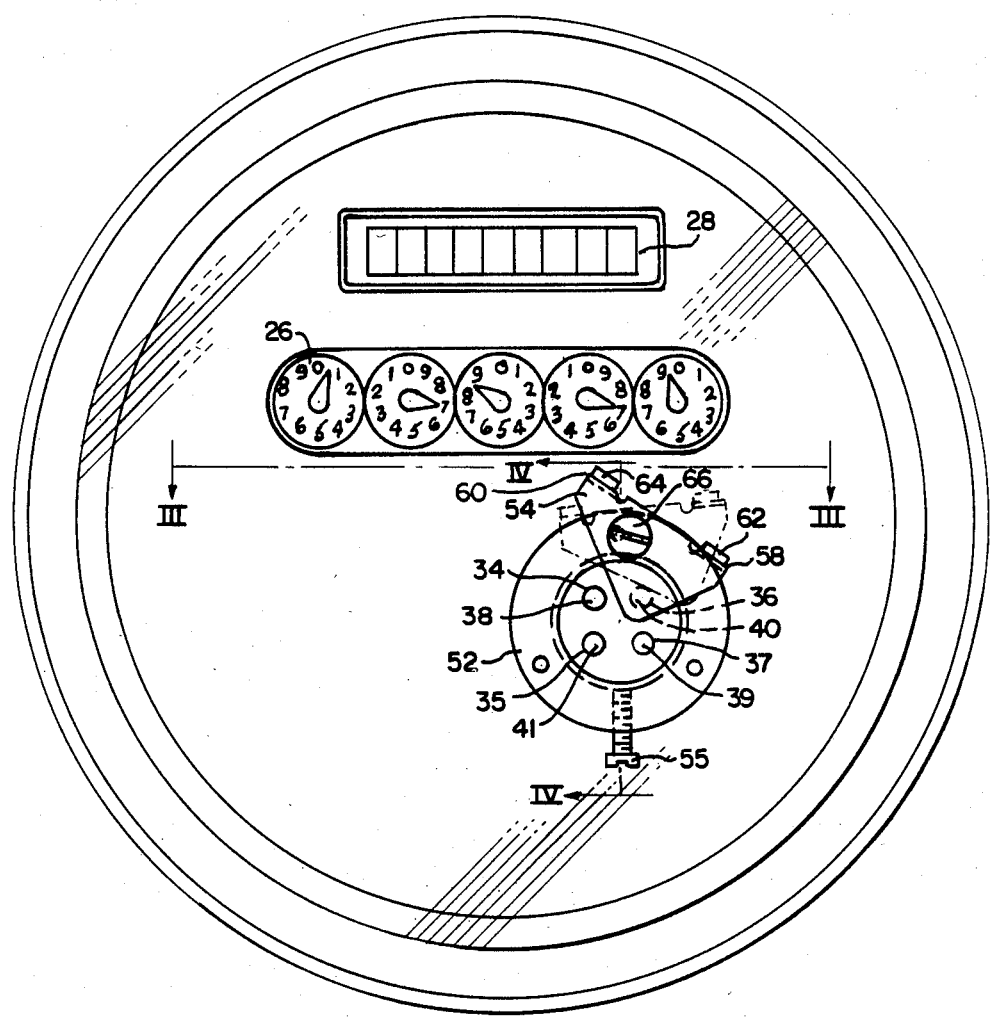
FIG. 2 is a front elevational view showing the watt-hour meter of FIG. 1.

Various modes of data output may be provided by the meter 14. For example, if the meter 14 includes an electromechanical induction watt-hour metering system, the accumulated kilowatt-hour data may be displayed on mechanical register dials 26 as shown in FIGS. 1 and 2. Data output may also be supplied by electronic light-emitting numeric display indicators 28 mounted upon a circuit board 30.

As can be seen in FIG. 1, the apparatus 10 also includes a portable electronic programmer/reader device 12 (hereinafter called an EPR) which cooperates with the meter 14 to provide data input/output capability via a four-channel infra-red optical system interfacing with the meter 14 through a four-channel input/output port 31 which includes a cylindrically shaped tunnel baffle member 32.

The baffle 32 includes four tunnel apertures 34, 35, 36, and 37, at the base of which are situated a pair of infra-red light-emitting diodes (LED's) 38 and 39 and a pair of infra-red-sensitive phototransistors 40 and 41. The LED's 38 and 39 constitute a pair of output channels DATA OUT and STROBE OUT, respectively. The two phototransistors 40 and 41 constitute a pair of input channels designated DATA IN and STROBE IN, respectively.

The EPR 12 includes a pair of infra-red-sensitive phototransistors 42 and 43 and a pair of infra-red light-emitting diodes 44 and 45. The phototransistors 42 and 43 and LED's 44 and 45 cooperate with the LED's 38 and 39 and phototransistors 40 and 41 of the electronic register 15 to form data channels. When the EPR 12 is brought into proximity and alignment with the meter 14 as shown in FIG. 3, three probes 48 cooperate with corresponding detent depressions 50 in the cover 16 such that the LED's 44, 45 and phototransistors 42, 43 of the EPR 12 are in axial alignment with the tunnel apertures 34-37, LED's 38, 39 and phototransistors 40, 41 of the electronic register 15. In this manner, beams of infra-red radiation modulated with data can pass between the EPR 12 and electronic register 15, in the manner described in the aforementioned U.S. Pat. No. 4,298,839.

Data transmitted from the EPR 12 to the electronic register 15 may include such items as present time-of-day, the times at which the cost of a kilowatt-hour of electrical energy changes (that is, rate switch points), and demand periods. Data transmitted from the electronic register 15 to the EPR 12 may include time and date of previous meter reading, kilowatt-hours consumed since last meter reading, largest kilowatt demand reading since the previous meter reading and the serial numbers of the electronic register and meter.

Normally the electronic register 15 displays the current kilowatt-hour reading on the light-emitting display 28. However, during periods of darkness the continuous illumination of the display may be annoying or may generate an invitation to vandalism. Accordingly, in some installations it is desirable that the light-emitting display 28 be disabled at certain times during periods of darkness. In other words, the display "goes to sleep". During such inactive periods, however, the customer may desire to activate the display for a short period of time in order to read the meter. Accordingly, the electronic register 28 will activate a "wake-up" mode to illuminate the display for a limited period of time upon receipt of a pulse of radiation through the STROBE IN channel via the phototransistor 41. Such a radiation pulse may be generated, for example, by shining a flashlight into the front of the meter.

The system so far described is essentially the same as that of the aforementioned U.S. Pat. 4,298,839. This apparatus provides excellent service in most applications. However, under certain conditions, high levels of ambient radiation may cause spurious data to be accepted through the input port 31. Conditions which have been known to cause such spurious data include flashes of sunlight from windshields of passing vehicles. Accordingly, the present invention provides a means for shielding the input port 31 from such spurious input while at the same time permitting the wake-up feature to be utilized.

As can be seen in FIG. 2, the cylindrical baffle 32 has shielding apparatus mounted thereon consisting of a mounting ring 52 and a magnetically activated shutter plate 54. The mounting ring is fabricated of any suitable material such as machined aluminum and is secured to the baffle 32 by a mounting screw 55. The shutter plate 54 is essentially triangular in shape and includes a pair of folded tabs 58 and 60 as can be seen in FIGS. 3 and 4. Fixedly secured to the tabs 58 and 60 are a pair of permanent magnets 62 and 64 situated with the polarities as shown in FIG. 3. The shutter plate 54 is pivotally mounted to the mounting ring 52 by a shoulder screw 66 at a point offset from the center of the triangular shutter plate 54. The shoulder screw 66 includes a raised shoulder portion 68 slightly smaller than the pivoting mounting hole through the shutter plate 54. Accordingly, the shoulder screw 66 is screwed into the mounting ring 52 such that the shoulder portion 68 is firmly seated against the mounting ring 52. The shutter plate is thereby free to pivot about the screw 66. Since the mounting hole of the shutter is offset from the center of the shutter plate 54, the shutter plate 54 is held by gravity in a position such that the tab 58 rests against the mounting ring 52 and the phototransistor 40 of the DATA IN channel is shielded from radiation passing through the cover 16. However, the other three channels of the input port 31 are not shielded thereby.

As can be seen in FIG. 3, the EPR 12 includes two permanent magnets 70 and 72 affixed thereto. When the EPR 12 is positioned against the face of the cover 16 such that the probes 48 are seated in the depressions 50, the permanent magnets 70 and 72 of the EPR 12 are magnetically coupled to the permanent magnets 62 and 64 on the shutter plate 54. The polarities of the EPR magnets 70 and 72 are such that an attractive force is generated between the magnets 62 and 70 and between the magnets 64 and 72. This generates a torque upon the shutter plate 54 causing the shutter to rotate in a counterclockwise direction as seen in FIG. 2 such that the tab 60 now rests upon the mounting ring 52. This position is indicated in dashed lines in FIG. 2. As can be seen, the shutter plate 54 no longer shields the phototransistor 40 of the DATA IN channel of the electronic register 15, permitting transmission of infra-red radiation between the LED 44 of the EPR 12 and the phototransistor 40 of the electronic register 15.

When the desired data transmission between the EPR 12 and electronic register 15 has been completed, the EPR is removed. Since magnetic flux is no longer coupled to the shutter plate 54, it is rotated by gravity in a clockwise direction as seen in FIG. 2 to the position wherein the shutter plate 54 shields the DATA IN channel of the input port 31 such that radiation transmitted through the cover 16 can no longer reach the phototransistor 40. It should be noted, however, that the phototransistor 41 of the STROBE IN channel remains clear at all times and the shutter plate 54 never blocks this channel.

It can be seen that in the described embodiment, no extra action on the part of an operator is required to provide the necessary shielding of DATA IN channel during normal operations nor to remove the shutter 54 from its shielding position at such time as data transmission is desired. The movement of the shutter plate 54 is accomplished in a completely automatic manner in conjunction with the normal programming and reading operations of the EPR 12.

Alternative embodiments are possible. For example, with combinations of certain electronic registers, covers, and EPR's, it may be desirable to provide a shutter plate of ferromagnetic material but without permanent magnets attached thereto. Permanent magnets would be attached to the EPR of such a size and in such a position that the ferromagnetic shutter plate would be automatically rotated to a non-blocking position when the EPR is placed into position for a data transmission between the EPR and the electronic register. Similarly, the permanent magnets could be removed from the EPR in certain applications and replaced with a piece of ferromagnetic material designed to couple to permanent magnets attached to the shutter plate. In each case, means are provided to couple magnetic flux through the transparent cover of the meter to a movable shutter plate, such that the shutter plate may be selectively removed from a blocking position to expose one or more of the data channels of the electronic register.

Figure 5:
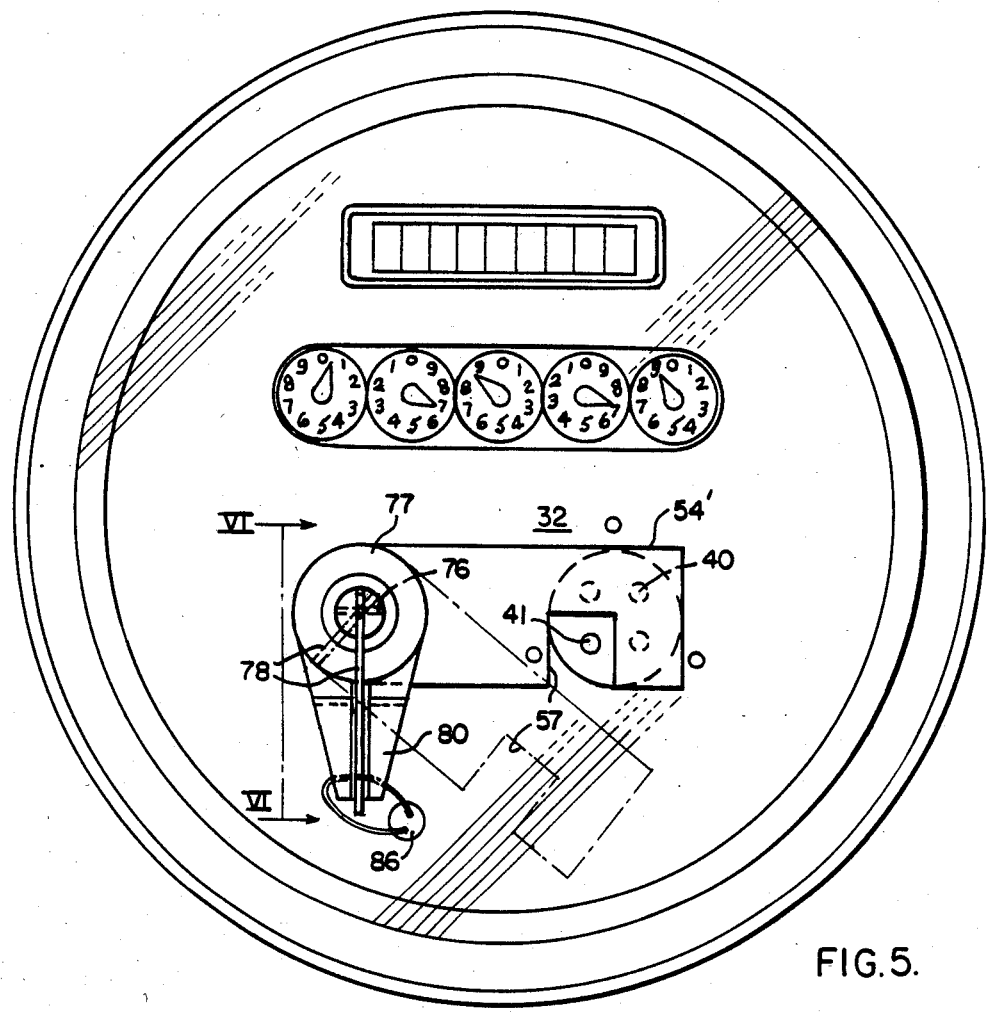
FIG. 5 is a front elevational view of an alternative embodiment of the present invention.
Figure 6:
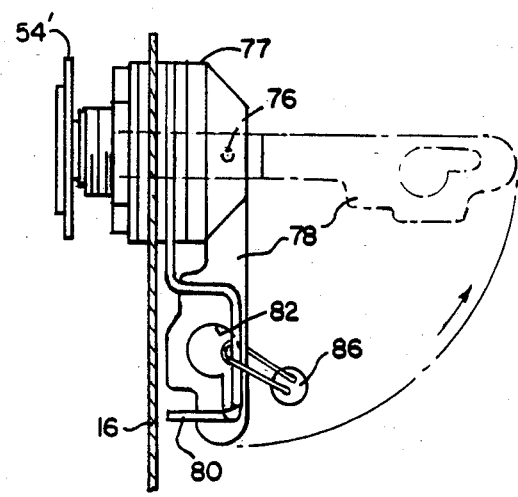
FIG. 6 is a side sectional view of the embodiment of FIG. 5, taken along the line VI—VI of FIG. 5.

A further alternative embodiment is shown in FIGS. 5 and 6. A shutter plate 54' having a cut-out 57 is secured to a pin 76 extending through the cover 16 and pivotally mounted thereon by a bushing 77. A key lever 78 is pivotally attached on the outside of the cover 16 to the pin 76.

A locking bracket 80 is secured to the cover 16 on the outside thereof and is adapted to receive the key lever 78. The key lever 78 includes an aperture 82. When the key lever 78 is in the position shown in solid lines in FIGS. 5 and 6, the aperture 82 in the lever 78 lines up with the bracket 80 to permit a wire seal 86 to be inserted therethrough. With the wire seal 86 inserted, it is not possible to raise the lever 78. The shutter plate 54' shields the phototransistor 40 of the DATA IN channel and remains locked in this position by the lever 78, bracket 80 and seal 86. Note, however, that the cut-out 57 leaves the phototransistor 41 of the STROBE IN channel exposed to radiation through the cover 16 even when the plate 54' is so locked.

Removal of the wire seal 86 allows the lever 78 to be raised to the position shown in dashed lines in FIG. 6, away from the bracket 80. The pin 76 may then be rotated to cause the shutter plate 54' to also rotate and expose the phototransistor 40 to radiation passing through the cover. The alternative embodiment shown in FIGS. 5 and 6 is especially suitable for location where an extra measure of security is desired.

In summary, it can be seen that the present invention provides electronic power distribution apparatus having a radiation responsive input data port which is protected against the adverse affects of undesirable ambient radiation yet retains the capability to respond to a desired pulse of radiation for auxiliary metering functions.

What is claimed is:

1. Electric power distribution apparatus, comprising:
   a fixed data processing component coupled to an electric utility power distribution circuit for processing data related to said circuit, said fixed component comprising radiation responsive input means for receiving external data transmitted to said fixed component;
   a cover attached to said fixed component, said cover providing protection for said fixed component while permitting transmission of radiation therethrough;
   a portable data processing component for generating radiation modulated with data to be transmitted to said fixed component; and
   shutter means attached to said fixed component interiorly of said cover for preventing radiation transmitted through said cover from reaching said input means, said shutter means comprising means responsive to magnetic flux for selectively permitting transmission of radiation through said cover to said input means.

2. Apparatus as recited in claim 1, further comprising:
   activating means attached to said portable component for coupling magnetic flux through said cover to said magnetic flux responsive means, whereby said magnetic flux responsive means is activated to permit transmission of radiation between said fixed component and said portable component.

3. Apparatus as recited in claim 2 wherein said shutter means is maintained in a first position by gravity, said first position preventing transmission of radiation to said input means.

4. Apparatus as recited in claim 2 wherein said cover comprises means for aligning said portable component with said input means.

5. Apparatus as recited in claim 4 wherein said responsive means comprises a movable plate maintained in a first position shielding said input means from radiation transmitted through said cover; and
   wherein said portable component comprises a permanent magnet secured thereto in a position such that magnetic flux is coupled to said movable plate when said fixed component is aligned with said portable component by said aligning means, said magnetic flux being operable to move said movable plate to a second position whereby radiation can be transmitted through said cover between said portable component and said fixed component.

6. Apparatus as recited in claim 5 wherein said movable plate is constructed of ferromagnetic material.

7. Apparatus as recited in claim 5 wherein said fixed component comprises multiple-channel input means and wherein said movable plate permits transmission of radiation at all times through said cover to at least one channel of said input means.

8. Apparatus as recited in claim 2 wherein said responsive means comprises a movable plate maintained in a first position shielding said input means from radiation transmitted through said cover, said plate comprising a permanent magnet affixed thereto, and wherein
said portable component comprises means for coupling magnetic flux to said permanent magnet when said portable component is aligned with said fixed component such that sufficient force is generated to move said movable plate to a second position permitting transmission or radiation between said portable and fixed components.

9. Apparatus as recited in claim 8 wherein said movable plate comprises two permanent magnets.

10. Apparatus as recited in claim 9 wherein said two permanent magnets are positioned with opposite polarities with respect to said cover.

11. Apparatus as recited in claim 9 wherein said movable plate is pivotally supported and wherein said two permanent magnets are positioned on either side of the pivot axis of said movable plate.

12. Apparatus as recited in claim 8 wherein said portable component magnetic flux coupling means comprises a permanent magnet.

13. Apparatus as recited in claim 8 wherein said fixed component comprises multiple-channel input means and wherein said movable plate permits transmission of radiation through said cover to at least one channel of said input means at all times.

14. Apparatus as recited in claim 1 wherein said shutter means comprises a shutter plate movably secured to said fixed component and operating means connected to said shutter plate and extending through said cover for moving said shutter plate to selectively permit transmission of radiation through said cover to said input means.

15. Apparatus as recited in claim 14 wherein said operating means comprises a pin extending through said cover and rotatably mounted thereon.

16. Apparatus as recited in claim 14 comprising locking means secured to said cover and cooperating with said pin to prevent rotation thereof.

17. Apparatus as recited in claim 14 wherein said operating means further comprises a key lever secured to said pin exteriorly of said cover to facilitate rotation of said pin.

18. Apparatus as recited in claim 17 wherein said key lever is connected to said pin and is operable between a first position interacting with said locking means to prevent rotation of said pin and a second position free of said locking means to permit rotation of said pin.

* * * * *